(12) United States Patent
Gutierrez, III et al.

(10) Patent No.: US 11,239,185 B2
(45) Date of Patent: Feb. 1, 2022

(54) EMBEDDED RESISTOR-CAPACITOR FILM FOR FAN OUT WAFER LEVEL PACKAGING

(71) Applicant: Dialog Semiconductor (UK) Limited, London (GB)

(72) Inventors: Ernesto Gutierrez, III, Swindon (GB); Jesus Mennen Belonio, Jr., Neubiberg (DE); Shou Cheng Eric Hu, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/802,873

(22) Filed: Nov. 3, 2017

(65) Prior Publication Data

US 2019/0139911 A1    May 9, 2019

(51) Int. Cl.
*H01L 23/64*    (2006.01)
*H01L 23/00*    (2006.01)
(Continued)

(52) U.S. Cl.
CPC ............ *H01L 23/647* (2013.01); *H01L 21/56* (2013.01); *H01L 21/76877* (2013.01); *H01L 21/78* (2013.01); *H01L 23/3128* (2013.01); *H01L 23/49822* (2013.01); *H01L 23/5226* (2013.01); *H01L 23/5389* (2013.01); *H01L 23/53228* (2013.01); *H01L 23/642* (2013.01); *H01L 24/14* (2013.01); *H01L 24/19* (2013.01); *H01L 24/20* (2013.01); *H01L 2224/0239* (2013.01); *H01L 2224/16225* (2013.01); *H01L 2224/18* (2013.01); *H01L 2924/01029* (2013.01); *H01L 2924/15174* (2013.01); *H01L 2924/15311* (2013.01); *H01L 2924/181* (2013.01); *H01L 2924/19015* (2013.01); *H01L 2924/19105* (2013.01); *H01L 2924/3511* (2013.01)

(58) Field of Classification Search
CPC ..................... H01L 23/647; H01L 23/5389
USPC .......................................... 257/724
See application file for complete search history.

(56) References Cited

U.S. PATENT DOCUMENTS 9,779,880 B2    10/2017    Cheng et al.
2001/0038906 A1*  11/2001   O'Bryan ............... H05K 1/162
                                                   428/209

(Continued)

OTHER PUBLICATIONS

German Office Action, File No. 10 2018 207 217.5, Applicant: Dialog Semiconductor (UK) Limited, dated Mar. 31, 2021, 8 pages.

*Primary Examiner* — Thao X Le
*Assistant Examiner* — Laura M Dykes
(74) *Attorney, Agent, or Firm* — Saile Ackerman LLC; Stephen B. Ackerman; Rosemary L. S. Pike

(57) ABSTRACT

A panel type fan-out wafer level package with embedded film type capacitors and resistors is described. The package comprises a silicon die at a bottom of the package wherein a top side and lateral sides of the silicon die are encapsulated in a molding compound, at least one redistribution layer connected to the silicon die through copper posts contacting a top side of the silicon die, at least one embedded capacitor material (ECM) sheet laminated onto the package, and at least one embedded resistor-conductor material (RCM) sheet laminated onto the package wherein the at least one redistribution layer, capacitors in the at least one ECM, and resistors in the at least one RCM are electrically interconnected.

11 Claims, 7 Drawing Sheets

(51) Int. Cl.
*H01L 23/31* (2006.01)
*H01L 23/538* (2006.01)
*H01L 23/498* (2006.01)
*H01L 21/56* (2006.01)
*H01L 21/768* (2006.01)
*H01L 21/78* (2006.01)
*H01L 23/522* (2006.01)
*H01L 23/532* (2006.01)

(56) References Cited

U.S. PATENT DOCUMENTS

| | | | |
|---|---|---|---|
| 2007/0003781 A1* | 1/2007 | de Rochemont | B82Y 30/00 |
| | | | 428/615 |
| 2010/0140772 A1* | 6/2010 | Lin | H01L 21/76898 |
| | | | 257/686 |
| 2010/0140779 A1* | 6/2010 | Lin | H01L 23/49816 |
| | | | 257/690 |
| 2010/0193225 A1* | 8/2010 | Abe | H05K 1/167 |
| | | | 174/257 |
| 2011/0316117 A1 | 12/2011 | Kripesh et al. | |
| 2016/0300797 A1 | 10/2016 | Shim et al. | |
| 2017/0170031 A1 | 6/2017 | Li et al. | |
| 2017/0287856 A1 | 10/2017 | Lee et al. | |
| 2019/0131273 A1* | 5/2019 | Chen | H01L 23/5389 |

* cited by examiner

EMBEDDED RESISTOR-CAPACITOR FILM FOR FAN OUT WAFER LEVEL PACKAGING

(1) TECHNICAL FIELD

This disclosure is related to wafer packaging technologies, and more particularly, to wafer packaging technologies combining fan out wafer level packaging with printed circuit board/substrate fabrication techniques.

(2) BACKGROUND

Fan out wafer level Package (FO WLP or eWLB) is said to be the future of advanced packaging. This type of package is illustrated in FIG. 1. SiP (System in Package) is another advanced packaging solution that can integrate multiple chips and active and passive discrete components using a substrate interposer 10, as shown in FIG. 2, where the die 20 is integrated with passive components such as resistors 42 and capacitors 44 and other active components. A disadvantage of SiP is that the substrate material will add to the total thickness of the package. The FO WLP package allows more units per wafer and the final package thickness will be thinner. The current FO WLP available in the industry is a single die packaging.

U.S. Patent Applications 2017/0170031 (Li et al) and 2017/0287856 (Lee et al) disclose various fan out wafer level packages. U.S. Pat. No. 9,779,880 (Chang et al) shows an embedded capacitor fabrication.

SUMMARY

It is the primary objective of the present disclosure to provide an embedded film resistor-capacitor fan out (EfRC-FO) package.

It is another objective of the disclosure to provide a packaging process that combines SIP and eWLB with embedded resistor and capacitor technology.

In accordance with the objectives of the present disclosure, a panel type fan-out wafer level package with embedded film type capacitors and resistors is achieved. The package comprises a silicon die at a bottom of the package wherein a top side and lateral sides of the silicon die are encapsulated in a molding compound, at least one redistribution layer connected to the silicon die through copper posts contacting a top side of the silicon die, at least one embedded capacitor material (ECM) sheet laminated onto the package, and at least one embedded resistor-conductor material (RCM) sheet laminated onto the package wherein the at least one redistribution layer, capacitors in the at least one ECM, and resistors in the at least one RCM are electrically interconnected.

Also in accordance with the objectives of the present disclosure, a method to fabricate a panel type fan out wafer level package with embedded film type capacitors and resistors is achieved. Copper posts are formed on a top side of a silicon wafer. The silicon wafer is singulated into a plurality of silicon dies. A plurality of silicon dies are reconstituted onto a panel and encapsulated with a molding compound on top and lateral sides. Thereafter, the panel is ground to expose the copper posts. Through-mold vias are opened through the molding compound outside of the silicon dies. The through-mold vias are filled with a conducting layer. Interconnecting layers are built up comprising: forming at least one redistribution layer connected to the silicon die through the copper posts and connected to the conducting layer in the through-mold vias, laminating at least one embedded capacitor material (ECM) sheet onto package, and laminating at least one embedded resistor-conductor material (RCM) sheet onto the package wherein the at least one redistribution layer, capacitors in the at least one ECM, and resistors in the at least one RCM are electrically interconnected. Metal plates are formed on a bottom side of the panel electrically contacting the through-mold via conducting layer. Solder balls are attached to the metal plates. The panel is singulated to form completed packages.

BRIEF DESCRIPTION OF THE DRAWINGS

In the accompanying drawings forming a material part of this description, there is shown.

DETAILED DESCRIPTION

The present disclosure combines FO WLP and SiP with the use of embedding film technology of resistors and capacitors for an improved package design. Thin film capacitors (ECM—embedded capacitor material) and resistors (RCM—Resistor-Conductor Material) have been used in substrate processing using standard lamination and photo processing techniques. Embedding the resistor and capacitor in a thin film results in a super thin form factor.

Other advantages of FO WLP SiP embedded with ECM & RCM film include:

1. Save significant real estate surface area.
2. Less parasitic inductance than discrete components (noise and EMI reduction) because of shorter routing between components and die.
3. Elimination of solder joints thus improves reliability of resistors and capacitors.
4. Enhance electrical performance with shorter leads and closer component placement.
5. Cost benefit since embedded passives are made by mass formation rather than mounting each individual component.
6. Less complex material inventory management than a magnitude of surface mount technology (SMT) type discrete passive components.

7. Can allow existing chips to be SiP with other available components rather than designing a new system on chip (SoC). This allows a faster time to market for a new design.

In the present disclosure, we propose to integrate a die of PMU (Power management unit), bluetooth, or MCU (microcontroller unit) through a hybrid panel based process (i.e. combination of FO WLP processing and PCB/Substrate Fabrication Techniques). This will enable a reduced size SIP package solution with the use of embedded film type resistors and capacitors.

Fabricating the FO WLP begins with wafer preparation (Cu post) and continues with reconstitution (die face up) and overmolding into a panel. Through mold via (TMV) is necessary to be able to achieve the vertical interconnect from the bottom land side to the redistribution layer (RDL) routing. Once the panel has the TMV and first RDL connected from the die Cu post, the build up of succeeding RDL, ECM and RCM is an additive process.

The ECM and RCM will be available in sheets and will be built up in between the dielectric polymer (PI—Polyimide). The ECM and RCM will be patterned (photo imaged), etched and laminated like standard PCB fabrication techniques. The structure can include multiples of RDL, ECM and RCM layers depending on the build up.

Figure 1:
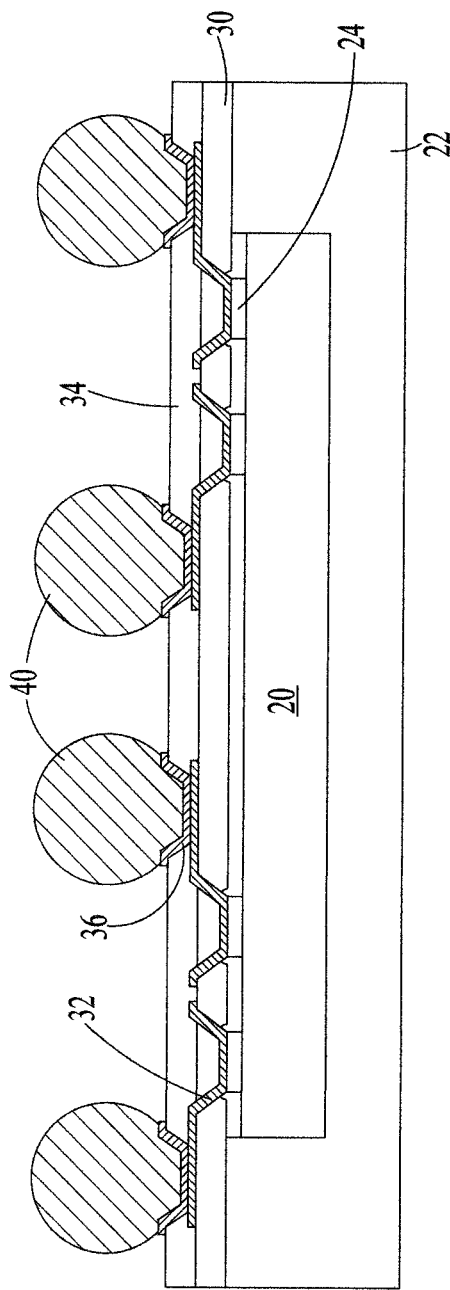
FIG. 1 is a cross-sectional representation of a fan out wafer level package of the prior art.
Figure 2:
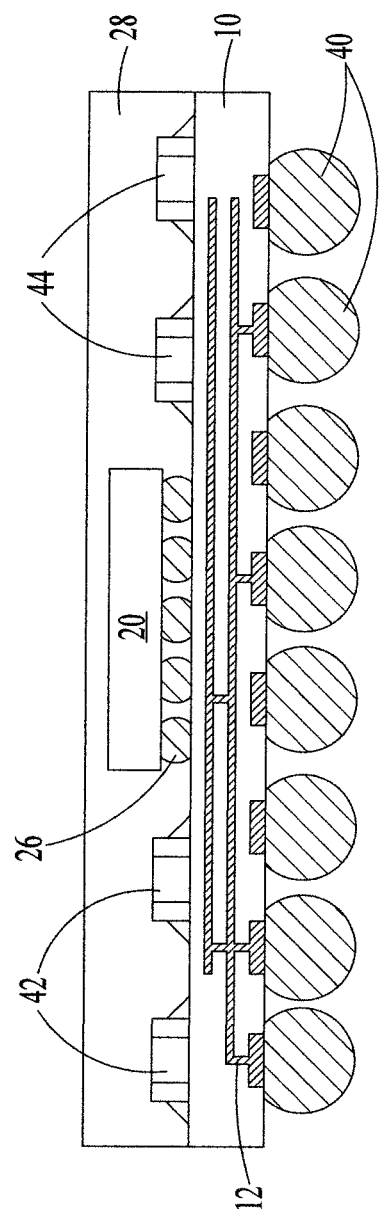
FIG. 2 is a cross-sectional representation of a system in package of the prior art.

The standard FO WLP consists of one die 20 that will be reconstituted (either face up or face down) in plastic molding 28 with RDL 12 (FIG. 2). In the package of the present disclosure, in addition to the FO WLP (chip first and face-up), TMV (Through mold via) and embedded film substrate processing are required.

Figure 3:
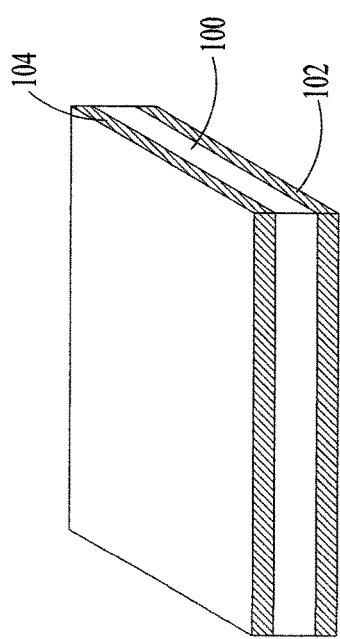
FIG. 3 is a cross-sectional representation of an embedded capacitor material (ECM) structure of the present disclosure.

There are various ECM manufacturers in the market for the embedded capacitor material, including 3M, Sanmina, DuPont and Shipley while OhmegaPly is a manufacturer of resistor-conductor material (RCM). As illustrated in FIG. 3, an ECM is made of a very thin layer of ceramic-filled epoxy 100, about 3 to 19 µm, sandwiched between two layers of 17 µm or 35 µm copper foil 102, 104 with a total thickness of 37 µm to 89 µm.

Figure 4:
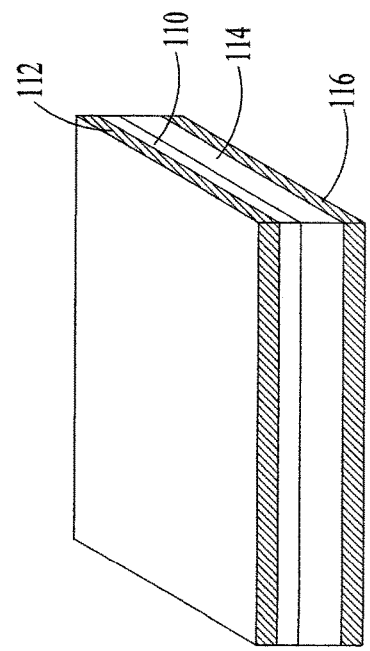
FIG. 4 is a cross-sectional representation of a resistor-conductor material (RCM) structure of the present disclosure.

As shown in FIG. 4, OhmegaPly RCM is a Nickel Phosphorous (NiP) metal alloy 110 that is electrodeposited on the copper foil 112 with overall thickness of 9 µm to 36 µm depending on the Cu thickness and NiP plating/resistance requirement. The RCM is then laminated to a dielectric material 114 on copper foil 116.

Since the ECM and RCM can be patterned (photoimaged and etched), they can satisfy various geometry requirements as different sizes of capacitors and resistors. Capacitance and resistivity will be dependent on the sheet thickness and surface area of the substrate films.

The embedded film resistor-capacitor fan out (EfRC-FO) package design of the present disclosure comprises four processing groups: 1) Wafer Preparation (Cu Post), 2) Reconstitution to panel, 3) Fan-out with RDL, ECM & RCM and 4) Backend Assembly finishing.

Figure 5:
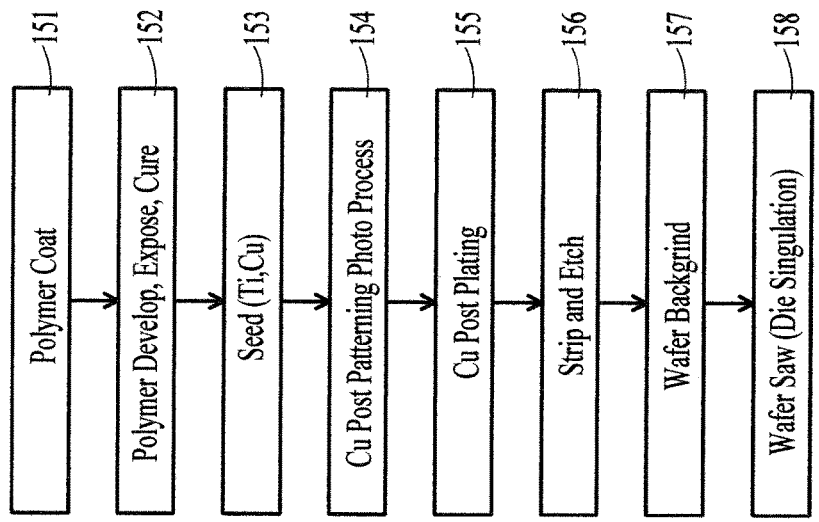
FIG. 5 is a flow chart of a first process of the present disclosure.
Figure 6:
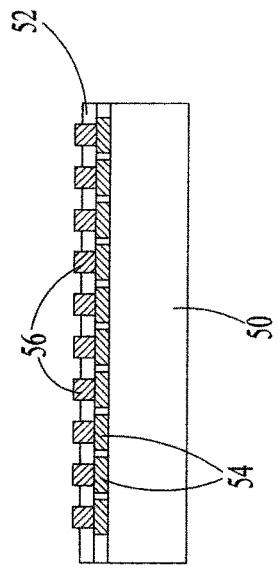
FIG. 6 is a cross-sectional representation of the package after the first process of the present disclosure.

Referring now to FIGS. 5-16, the process of fabricating a package of the present disclosure will be described in detail. FIG. 5 is a flow chart of the steps in the first process of the fabrication, the results of which are shown in FIG. 6.

Wafer Preparation is the formation of copper posts or studs on the native wafer using standard wafer-level chip scale processing (WLCSP). Once the copper post is formed, the wafer will then be thinned and diced. The diced wafer will provide PMU (Power management unit), bluetooth, MCU (microcontroller unit) dies, and any other application specific integrated circuits (ASIC). Referring now to FIGS. 5 and 6, wafer 50 is coated with a polymer 52, in step 151.

In step 152, the polymer is developed, exposed, and cured, wherein openings are made through the polymer to the pads 54 on the die.

In step 153, a seed layer, not shown, is deposited over the polymer layer and within the polymer openings. Preferably, the seed layer will be titanium or copper.

Now, in step 154, a photoresist mask is formed with openings where copper posts are to be placed. Copper posts 56 are plated onto the seed layer in the openings in step 155, as shown in FIG. 6. In step 156, the mask is stripped and the seed layer not covered by the copper is etched away.

Next, in step 157, the bottom side of the wafer 50 is ground away until a pre-determined portion of the wafer 50 has been removed. Grinding is performed to meet the total package height thickness requirement as well as to improve the warpage of the package and process and assembly handling during subsequent process steps. Finally in step 158, the wafer is sawed and singulated into individual dies.

Figure 7:
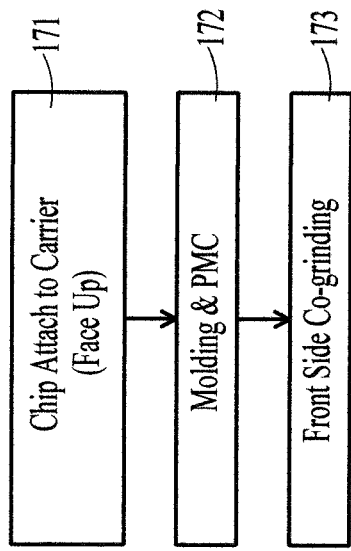
FIG. 7 is a flow chart of a second process of the present disclosure.
Figure 8:
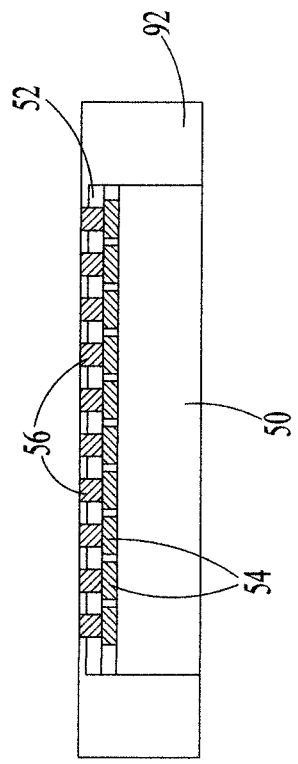
FIG. 8 is a cross-sectional representation of the package after the second process of the present disclosure.

Referring to the flowchart in FIG. 7 and the cross-section in FIG. 8, the second process of reconstitution to a panel is performed. In step 171, a plurality of dies 50 are attached to a carrier, not shown. In step 172, a molding compound 92 is coated on the top side of the die, encapsulating the die and copper pillars. The die is molded or encapsulated by a compression method using mold granular epoxy resin material with a fine filler to serve as the mold underfill. For example, the molding 92 is cured at about 175° C. for about 120 seconds. The molding thickness is preferably about 150 to 1000 µm. To finish cross-linking, the molding is postcured (PMC) at about 175° C. for about 6 hours. The plurality of dies covered with the molding compound form the panel.

Now the front side (top in FIG. 8) is ground to expose the tops of the copper posts 56, as shown in FIG. 8. The panel is removed from the carrier. Now the panel is ready for the fan-out process.

Figure 9:
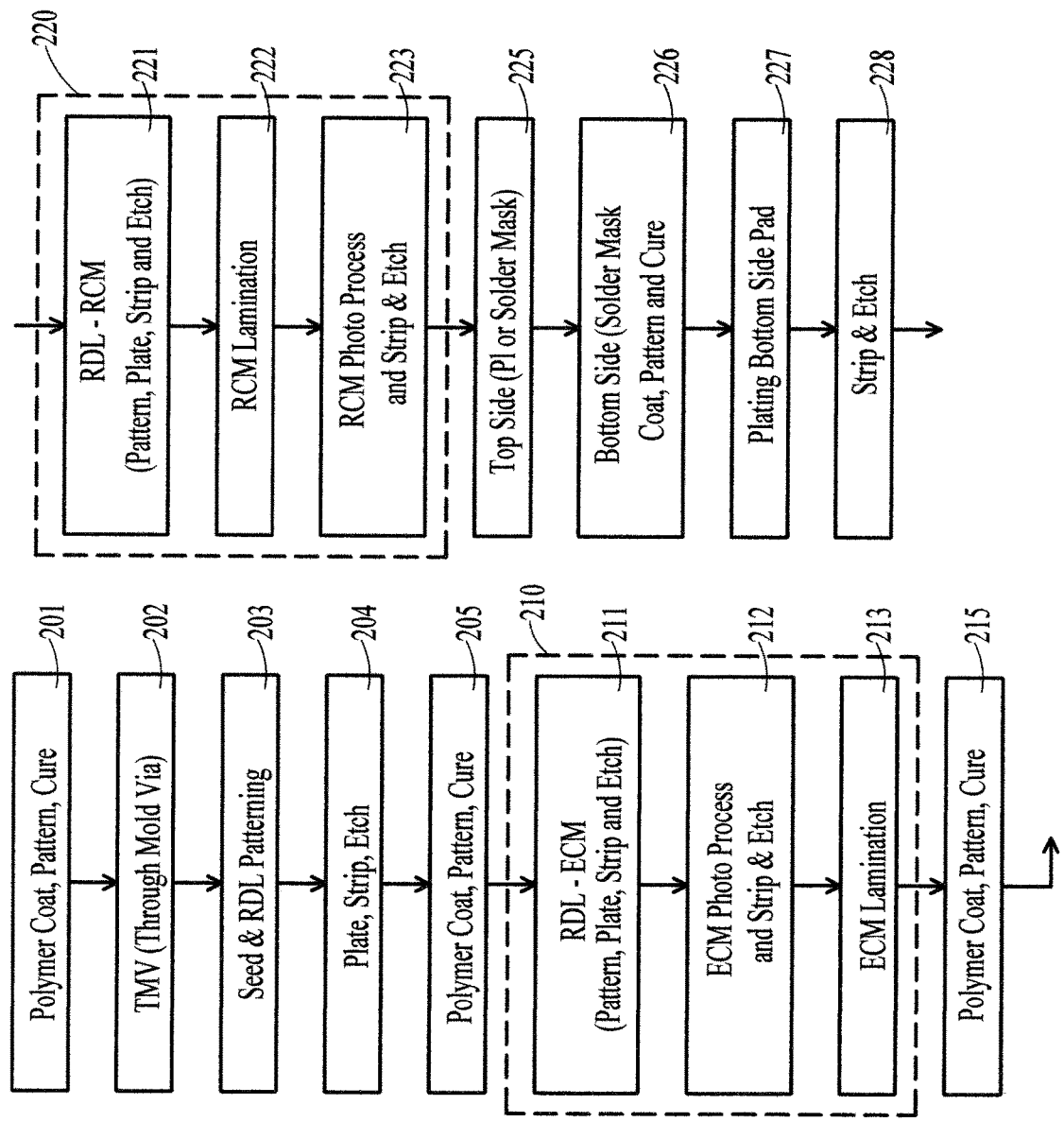
FIG. 9 is a flow chart of a third process of the present disclosure.

Referring now to FIGS. 9-14, the third process of the present disclosure will be described. The fan-out process starts with dielectric coating and through mold via (TMV) to provide vertical interconnection. The build-up (additive) process will follow with the RDL, ECM and RCM layers. As shown in FIG. 9, the first step 201 is to coat a polymer layer 302 on the top surface of the molded die 50.

Figure 10:
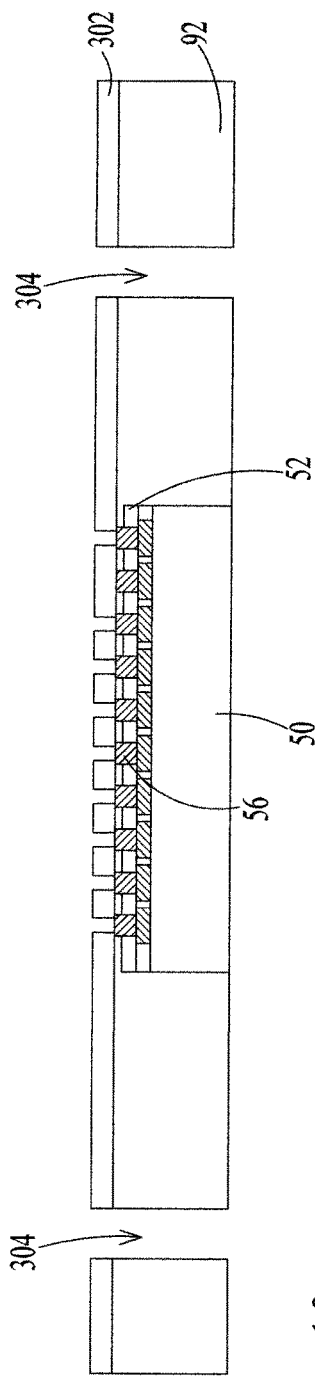
FIGS. 10-14 are cross-sectional representations of steps in the third process of the present disclosure.

The polymer material may be polyimide, coated to a thickness of between about 7-9 µm, as shown in FIG. 10. The polymer 302 is patterned to form openings over the copper posts 56 and to form openings where through mold vias (TMV) are to be formed outside of the die. After patterning, the polymer is cured.

Next in step 202, TMV's 304 are etched through openings in the polymer 302 all the way through the molding compound 92 to provide vias 304 opening to both the top and bottom sides of the package. TMV's 304 are shown in FIG. 10.

In step 203, a seed layer 306 is deposited over the polymer layer 302 and within the TMV and openings to the copper pillars. Now a photoresist mask, not shown, is formed to provide openings to the TMV's and to areas where the redistribution layer (RDL) is to be formed.

Figure 11:
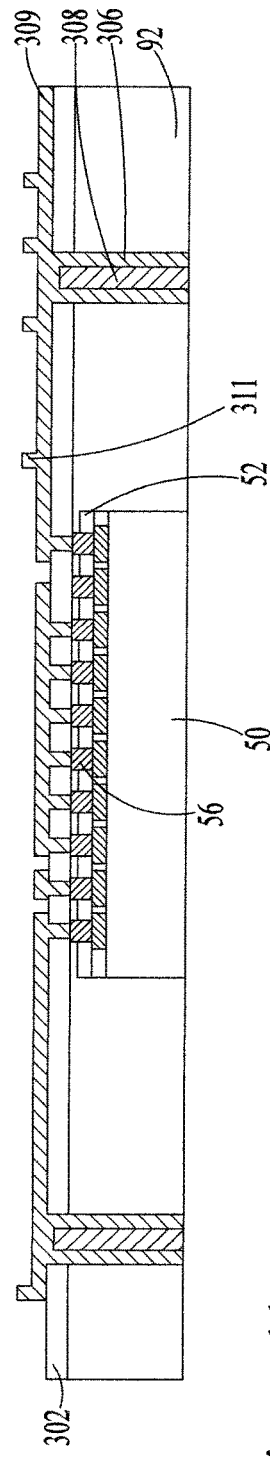

In step 204, as shown in FIG. 11, copper 308 is plated on the seed layer, filling the TMV's and forming the redistribution layer (RDL) 309. The photoresist mask is stripped and the seed layer etched away where it is not covered by the copper layer.

Figure 12:
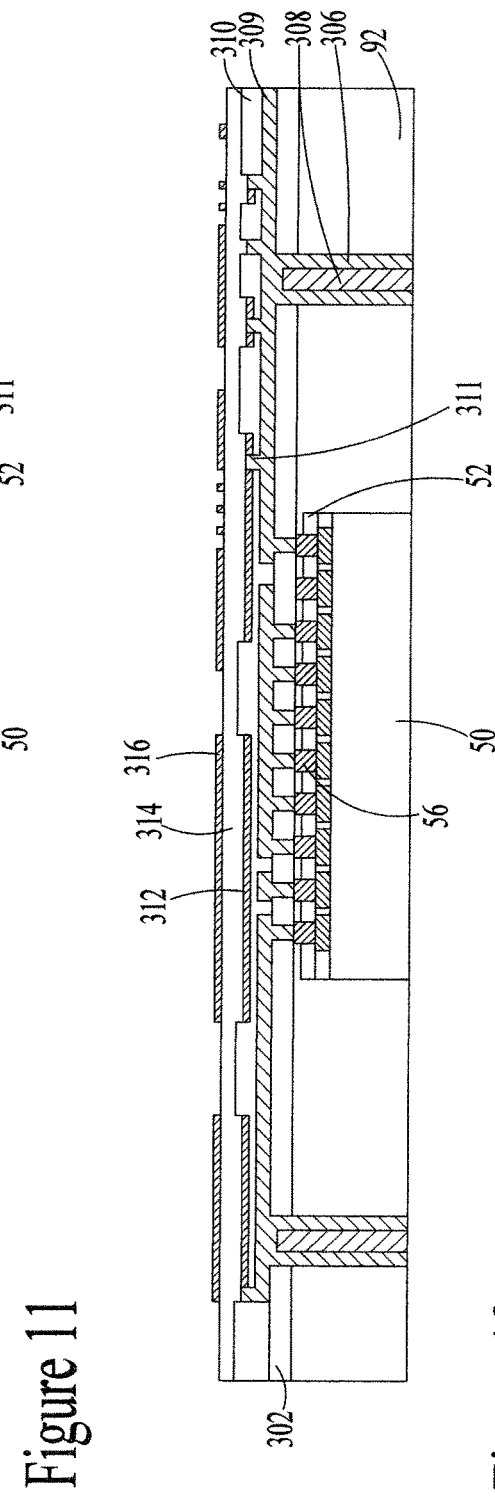

In step 205, polymer 310 is coated over the polymer 304 and RDL layer 309, as shown in FIG. 12.

The ECM and RCM are available in sheets and can be patterned and etched before they are laminated into the package. Steps 210 constitute the ECM process. In step 211, the polymer layer 310 is patterned to provide openings to the RDL layer 309. Copper is plated into the openings, photoresist is stripped, and seed layer etched away to provide RDL connection 311 for the ECM.

The ECM sheet comprises epoxy 314 and copper foil layers on bottom 312 and top 316. In step 212, the top and bottom copper layers of the ECM sheet, formed as shown in FIG. 3, are now patterned to form the capacitors, as shown in FIG. 12, using photoprocess, strip, and etch steps. Next, in step 213, the patterned ECM sheet is laminated onto the panel and electrically connected through the RDL pattern 311.

Figure 13:
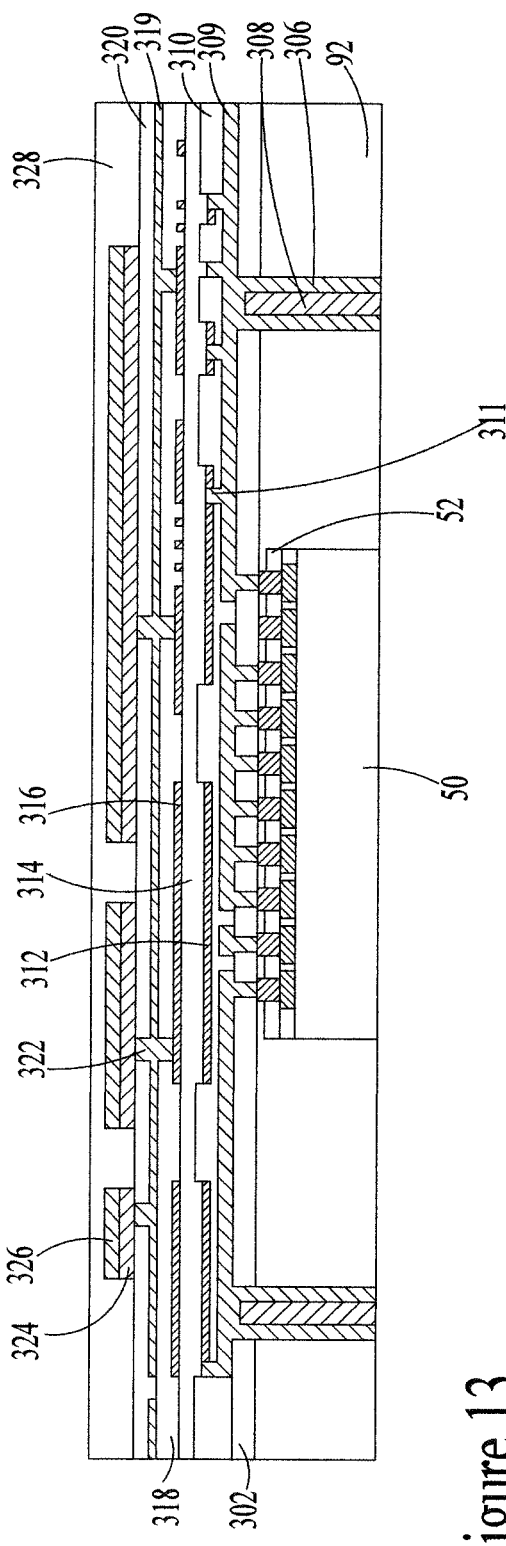

Next, in step 215, another polymer layer 318 is coated over the ECM, as shown in FIG. 13. Steps 220 constitute the RCM process. In step 221, the polymer layer 318 is patterned to provide openings to the top copper layer 316 of the ECM sheet. Copper is plated into the openings, photoresist is stripped, and seed layer etched away to provide RDL connection 322 between the RCM and the ECM.

The RCM sheet comprises bottom copper layer 319, dielectric 320, NiP layer 324, and top copper layer 326. In step 222, the RCM sheet is laminated onto the panel and electrically connected through the RDL pattern 322 to the top copper layer of the ECM sheet, as shown in FIG. 13. In step 223, using photoprocess, strip, and etch steps, the top copper layer 326 and NiP layer 324 of the RCM sheet are patterned. Alternatively, these layers may be patterned to form individual resistors prior to lamination.

The ECM and RCM sheets may be laminated onto the panel in any order and there may be multiple buildup layers, depending on package requirements.

Figure 14:
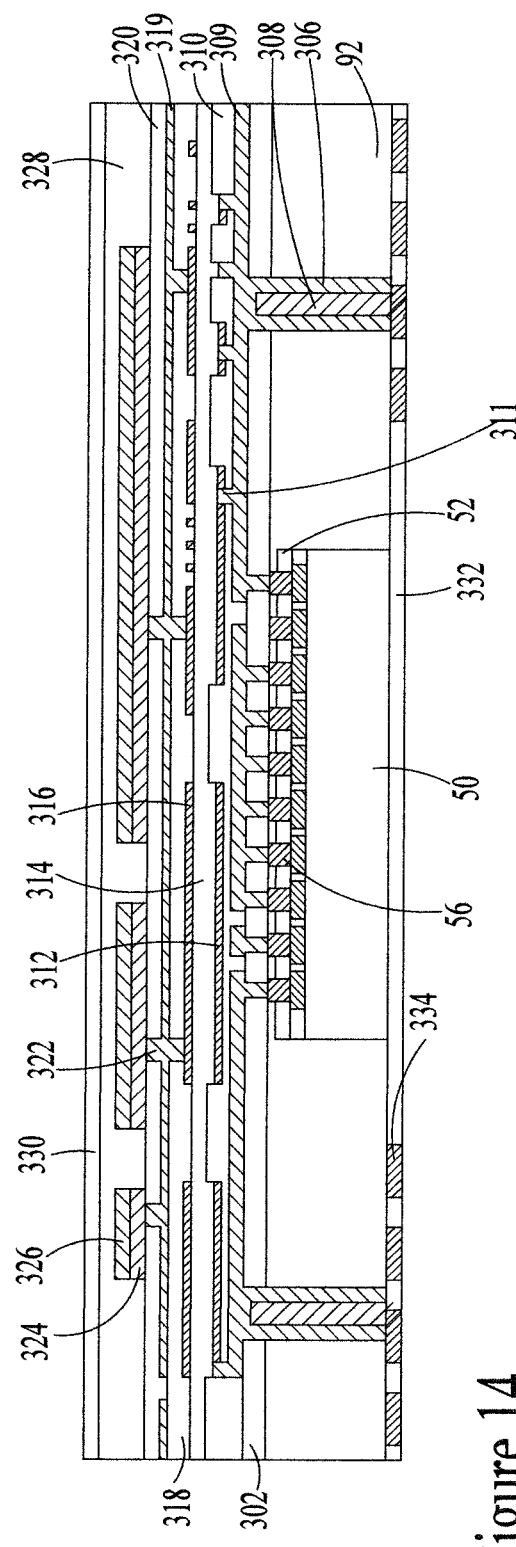

The top side and bottom side metal layers of the package can be formed through the RDL process. The topside and bottom will have protection using either Polyimide or solder mask, as shown in FIG. 14. In step 225, polyimide 328 and/or solder mask 330 are coated over the top of the panel.

In step 226, the panel is flipped and a solder mask or polyimide 332 is coated over the bottom surface of the panel. The bottom mask layer 332 is patterned using a photoresist mask to provide openings for solder bump attachment. In step 227, metal 334 is plated into the openings through the solder mask 332. In step 228, the photoresist mask is stripped and excess metal is etched away.

Figure 15:
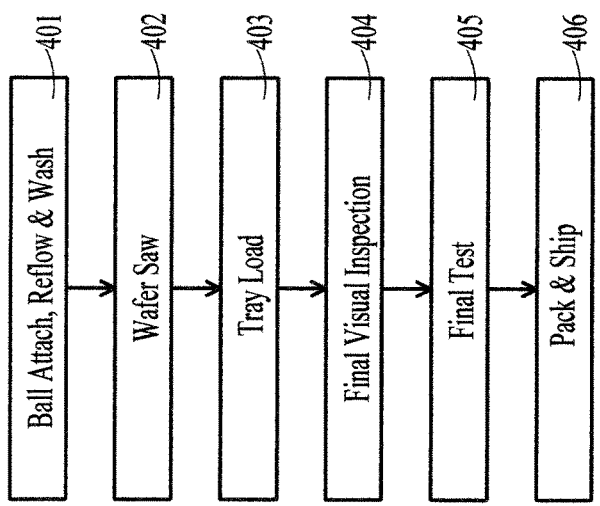
FIG. 15 is a flow chart of a fourth process of the present disclosure.
Figure 16:
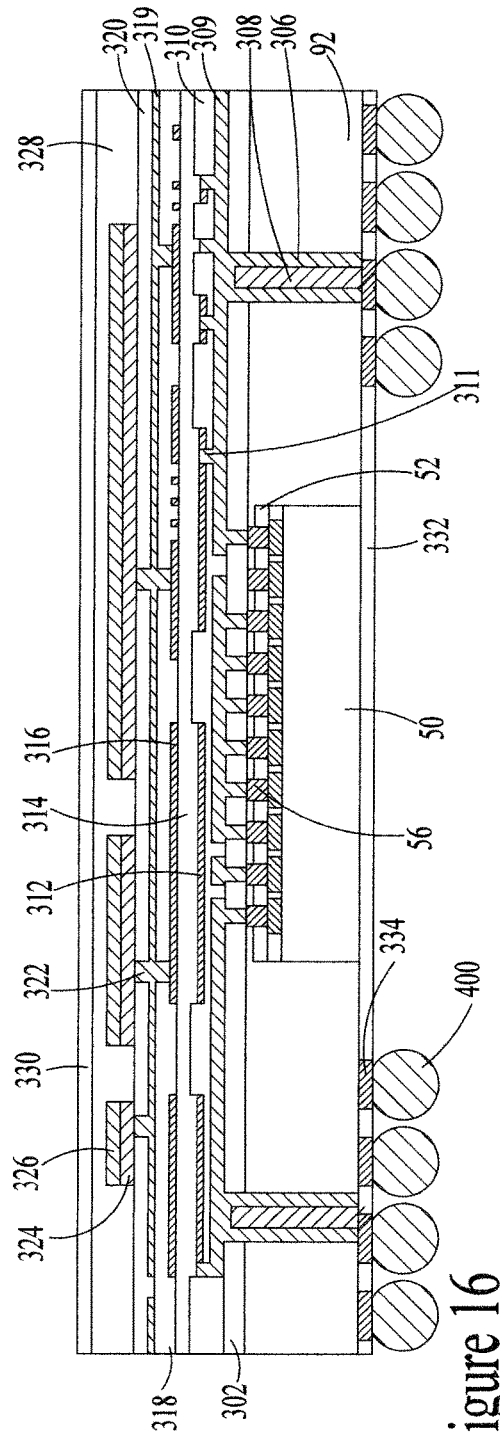
FIG. 16 is a cross-sectional representation of the completed package of the present disclosure.

The panel is now ready for the Backend Assembly finishing steps, illustrated in the flowchart in FIG. 15 and in cross-section in FIG. 16. In step 401, solder balls 400 are attached to the panel onto the metal plates 334. In step 402, the wafer is sawed and singulated, and loaded in a tray (step 403) for final visual inspection (step 404) and final test (step 405). Finally the completed packages will be ready for pack and ship (step 406).

FIG. 16 shows the completed package. The silicon chip 50, encapsulated by molding compound 92, contacts solder mask 332 at the bottom of the package. Connecting to the top of the silicon chip through copper posts 56 are fan-out redistribution layers 309, 311, 322 and embedded capacitors (312/314/316) and resistors (319/320/324/326) under a top polyimide or solder mask 330. The RDL, capacitors, and resistors are all electrically interconnected. The RDL, capacitors, and resistors are electrically connected to the solder balls 400 through the TMV's 308.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A panel type fan out wafer level package with embedded film type capacitors and resistors comprising:
    only one silicon die wherein a top side and lateral sides of said silicon die are encapsulated in a molding compound;
    at least one redistribution layer connected to said silicon die through copper posts contacting said top side of said silicon die;
    at least one embedded capacitor material (ECM) sheet laminated onto said package over said redistribution layer wherein said at least one ECM sheet comprises a ceramic-filled epoxy layer sandwiched between two copper foil layers;
    at least one embedded resistor-conductor material (RCM) sheet laminated onto said package over said redistribution layer wherein said at least one RCM sheet comprises a nickel phosphorus layer laminated to an overlying first copper foil layer and to an underlying dielectric layer wherein said dielectric layer is laminated to an underlying second copper foil layer, wherein copper-filled vias connect said ECM with said RCM, and wherein said copper posts, said at least one redistribution layer, capacitors in said at least one ECM, and resistors in said at least one RCM are electrically interconnected in said panel type fan out wafer level package; and
    a topside solder protection mask on a top surface of said package and a bottomside solder protection mask on a bottom surface of said package wherein said bottomside solder protection mask coats an entire bottom side of said silicon die.

2. The package according to claim 1 wherein said at least one redistribution layer comprises copper.

3. The package according to claim 1 further comprising through-mold vias interconnecting said at least one redistribution layer to solder balls attached to metal pads in openings through said bottomside solder protection mask.

4. The package according to claim 1 wherein said at least one ECM sheet and said at least one RCM sheet are laminated onto said package in any order.

5. The package according to claim 1 wherein a plurality of redistribution layers, a plurality of ECM sheets, and a plurality of RCM sheets are added to said package in any order.

6. A panel type fan out wafer level package with embedded film type capacitors and resistors comprising:
    only one silicon die at a bottom of said package wherein a top side and lateral sides of said silicon die are encapsulated in a molding compound;
    a bottomside solder protection mask on a bottom surface of said package wherein said bottomside solder protection mask directly contacts a bottom side of said silicon die;
    at least one redistribution layer connected to said silicon die through copper posts contacting said top side of said silicon die;
    copper through-mold vias interconnecting said at least one redistribution layer to solder balls attached to metal pads in openings through said bottomside solder protection mask on a bottom surface of said package;
    at least one embedded capacitor material (ECM) sheet laminated onto said package over said redistribution layer wherein aid a e ECM sheet comprises a diel layer sandwiched between copper foil layers;

at least one embedded resistor-conductor material (RCM) sheet laminated onto said package over said redistribution layer wherein said at least one RCM sheet comprises a nickel phosphorus layer laminated to a overlying first copper foil layer and to an underlying dielectric layer wherein said dielectric layer is laminated to an underlying second copper foil layer, wherein copper-filled vias connect said ECM with said RCM, and wherein said copper posts, said at least one redistribution layer, capacitors in said at least one ECM, and resistors in said at least one RCM are electrically interconnected in said panel type fan out wafer level package; and a topside solder protection mask on a top surface of said package wherein said bottom side solder protection mask coats an entire bottom side of said silicon die.

7. The package according to claim 6 wherein said at least one redistribution layer comprises copper.

8. The package according to claim 6 wherein said at least one ECM sheet and said at least one RCM sheet are laminated onto said package in any order.

9. The package according to claim 6 wherein a plurality of redistribution layers, a plurality of ECM sheets, and a plurality of RCM sheets are added to said package in any order.

10. A panel type fan out wafer level package with embedded film type capacitors and resistors comprising:

only one silicon die at a bottom of said package wherein a top side and lateral sides of said silicon die are encapsulated in a molding compound;

a bottomside solder protection mask on a bottom surface of said package wherein said bottomside solder protection mask directly contacts a bottom side of said silicon die;

at least one copper post through said molding compound contacting said top side of said silicon die;

at least one redistribution layer connected to said silicon die through said copper post;

copper through-mold vias interconnecting said at least one redistribution layer to solder balls attached to metal pads in openings through said bottomside solder protection mask;

at least one embedded capacitor material (ECM) sheet laminated onto said package over said redistribution layer wherein said at least one ECM sheet comprises a dielectric layer sandwiched between two copper foil layers;

at least one embedded resistor-conductor material (RCM) sheet laminated onto said package over said redistribution layer wherein said at least one RCM sheet comprises a nickel phosphorus layer laminated to an overlying first copper foil layer and to an underlying dielectric layer wherein said dielectric layer is laminated to an underlying second copper foil layer, wherein copper filled vias connect said ECM with said RCM, and wherein said copper posts, said at least one redistribution layer, capacitors in said at least one ECM, and resistors in said at least one RCM are electrically interconnected in said panel type fan out wafer level package; and a topside solder protection mask on a top surface of said package wherein said bottomside solder protection mask coats an entire bottom side of said silicon die.

11. The package according to claim 10 wherein said at least one redistribution layer comprises copper.

* * * * *